(12) United States Patent
Miyahara et al.

(10) Patent No.: US 9,000,567 B2
(45) Date of Patent: Apr. 7, 2015

(54) COMPOUND SEMICONDUCTOR SUBSTRATE

(75) Inventors: Kenichi Miyahara, Itami (JP); Takayuki Nishiura, Itami (JP); Mitsutaka Tsubokura, Itami (JP); Shinya Fujiwara, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 401 days.

(21) Appl. No.: 13/473,043

(22) Filed: May 16, 2012

(65) Prior Publication Data

US 2012/0292747 A1     Nov. 22, 2012

Related U.S. Application Data

(60) Provisional application No. 61/487,512, filed on May 18, 2011.

(30) Foreign Application Priority Data

May 18, 2011   (JP) ................. 2011-110980

(51) Int. Cl.
| | | |
|---|---|---|
| H01L 23/58 | (2006.01) | |
| H01L 21/02 | (2006.01) | |
| H01L 29/66 | (2006.01) | |
| H01L 29/778 | (2006.01) | |
| H01L 29/20 | (2006.01) | |

(52) U.S. Cl.
CPC .... *H01L 21/02052* (2013.01); *H01L 29/66462* (2013.01); *H01L 29/7787* (2013.01); *H01L 29/20* (2013.01)

(58) Field of Classification Search
None
See application file for complete search history.

(56) References Cited

U.S. PATENT DOCUMENTS

2007/0207615 A1 *   9/2007   Sakamoto ............. 438/691

FOREIGN PATENT DOCUMENTS

| JP | 6-151304 A | 5/1994 |
|---|---|---|
| JP | 7-211688 | 8/1995 |
| JP | 10-12553 A | 1/1998 |
| JP | 10-79363 | 3/1998 |
| JP | 2000-340535 | 12/2000 |
| JP | 2001-53011 A | 2/2001 |
| JP | 2007-235036 A | 9/2007 |

\* cited by examiner

*Primary Examiner* — Kyoung Lee
(74) *Attorney, Agent, or Firm* — Drinker Biddle & Reath LLP

(57) ABSTRACT

An object is to provide a compound semiconductor substrate and a surface-treatment method thereof, in which, even after the treated substrate is stored for a long period of time, resistance-value defects do not occur. Even when the compound semiconductor substrate is stored for a long period of time and an epitaxial film is then formed thereon, electrical-characteristic defects do not occur. The semiconductor substrate according to the present invention is a compound semiconductor substrate at least one major surface of which is mirror-polished, the mirror-polished surface being covered with an organic substance containing hydrogen (H), carbon (C), and oxygen (O) and alternatively a compound semiconductor substrate at least one major surface of which is mirror-finished, wherein a silicon (Si) peak concentration at an interface between an epitaxial film grown at a growth temperature of 550° C. and the compound semiconductor substrate is $2 \times 10^{17}$ cm$^{-3}$ or less.

10 Claims, 8 Drawing Sheets

COMPOUND SEMICONDUCTOR SUBSTRATE

This application claims the benefit of U.S. Provisional Application No. 61/487,512, filed May 18, 2011, which is incorporated by reference herein in its entirety.

TECHNICAL FIELD

The present invention relates to a method for cleaning a compound semiconductor substrate and a compound semiconductor substrate, in particular, to a method for cleaning a III-V compound semiconductor substrate composed of, for example, GaAs, InP, or GaP.

BACKGROUND ART

In general, a substrate of a III-V compound semiconductor crystal, in particular, a compound semiconductor single crystal of, for example, GaAs, InP, or GaP, is subjected to a process of mirror-polishing at least one major surface of the substrate with a chlorine-based polishing agent, subsequently cleaned with an acid or an alkali, and finally rinsed with ultrapure water and dried.

For example, Patent Literature 1 describes a cleaning method in which a natural oxide layer is formed in a surface of a GaAs substrate that is being polished, and the natural oxide layer is dissolved and removed from the surface of the GaAs substrate with ultrapure water having a dissolved oxygen content of 1 ppm or less.

Patent Literature 2 states that the surfaces of a substrate are oxidized and the substrate is then immersed in aqueous ammonia, an aqueous solution of sodium hydroxide, phosphoric acid, hydrochloric acid, or hydrofluoric acid.

Patent Literature 3 describes a cleaning method in which organic matter and metal on a surface of a substrate are removed and an oxide film of the substrate is then etched with an acidic solution; the substrate is then subjected to cleaning with an alkaline aqueous solution, subsequently to cleaning with ultrapure water, and then to drying. According to this method, foreign matter such as deposits can be completely removed.

CITATION LIST

Patent Literature

[PTL 1] Japanese Unexamined Patent Application Publication No. 10-079363
[PTL 2] Japanese Unexamined Patent Application Publication No. 07-211688
[PTL 3] Japanese Unexamined Patent Application Publication No. 2000-340535

SUMMARY OF INVENTION

Technical Problem

Although a GaAs substrate has an advantage of having a high electron mobility, an oxide film on the substrate is not an electrically insulating film like a $SiO_2$ film on a Si substrate. Accordingly, when an electron device is produced with a GaAs substrate, regions other than element operation regions need to be formed so as to have a high resistance such that current does not flow therethrough. For example, FIG. 1 illustrates a schematic sectional view of a high electron mobility transistor (HEMT) that is used as an electron device for a cellular phone. In this HEMT, an undoped high-purity epitaxial layer 2 is formed on a GaAs substrate 1 having a high resistance, and an electron supply layer 3 through which electrons flow is formed on the undoped high-purity epitaxial layer 2. Current (electrons) is intended to flow (11) through the interface between the undoped layer 2 and the electron supply layer 3 only. However, the undoped layer 2 underlying the electron supply layer has a very small thickness of about 1 µm. Accordingly, when the interface between the undoped layer 2 and the substrate 1 or the substrate 1 has a tendency of letting electricity pass therethrough, there are cases where source-drain current supposed to flow flows (12) beyond the undoped layer 2 through the interface between the undoped layer 2 and the substrate 1 or through the substrate and, as a result, electrical-characteristic defects of the device are caused.

When a HEMT is formed by growing an epitaxial film by metal organic chemical vapor deposition (MOCVD) or the like on a surface of a compound semiconductor substrate having been cleaned by an existing cleaning process, there are cases where impurities adhering to the substrate surface such as Si remain at the interface between the substrate and the undoped layer and, as a result, electrical-characteristic defects are caused.

In particular, Si incorporated into III-V compound semiconductor crystals such as GaAs crystals acts as an n-type impurity to considerably decrease the electrical resistance of the crystals. To prevent this phenomenon, in general, a substrate prior to epitaxial growth is held at a high temperature for a certain period of time in an epitaxial reactor to thereby decompose or evaporate impurities adhering to the substrate surface (thermal cleaning). However, such a method may cause problems: the epitaxial-growth time is increased to degrade the equipment productivity; and, when the substrate is excessively exposed to a high temperature, the substrate itself is decomposed or evaporated so that surface irregularities are formed and a desired epitaxial layer cannot be formed.

There is also a method in which, to make Si at the interface be inert, carbon (C) or oxygen (O) is made to adhere to the surface. However, this method has problems that the usage range (conditions) thereof is limited because, when the adhesion amount of Si is not controlled, electrical characteristics of the interface after the epitaxial growth become unstable; and, when the balance of impurities evaporating varies owing to difference in an atmosphere at the time of thermal cleaning in an epitaxial-growth reactor, electrical-characteristic defects may be caused.

The inventors studied the cause of the decrease in the electrical resistance at the interface between the epitaxial layer and the substrate and, as a result, have found that, when substrates having been cleaned are stored for a long period of time, a large number of the above-described electrical-characteristic defects are caused. For the purpose of evaluation, immediately after cleaning a semi-insulating GaAs mirror-surface substrate having a carbon concentration of $1\times10^{15}$ to $2\times10^{16}/cm^3$ in the crystal and a resistivity of $1\times10^7$ Ωcm to $6\times10^8$ Ωcm, the inventors formed a 1-µm undoped GaAs epitaxial film without thermal cleaning performed prior to the epitaxial growth so that the influence of impurities on the substrate surface was easily recognized. This substrate having the epitaxial film was measured in terms of the sheet resistance of the surface of the epitaxial film with an eddy-current probe used on the surface. As a result, when the substrate immediately after cleaning was used, the sheet resistance was 4 to $80\times10^4$Ω/□. In contrast, when a substrate that was placed in a polypropylene (PP) container, sealed in nitrogen, then sealed in an aluminum-coated plastic bag, and stored for 20 or more days was used, the sheet resistance decreased to 3 to $10 \times 10^3 \Omega/\square$.

Elemental analysis of the interface between the epitaxial film and the substrate was then performed with a magnetic-field secondary ion mass spectrometer (SIMS) by performing sputtering from the surface side of the epitaxial film. As a result, it has been found that there is a difference in the Si content between the substrate immediately after cleaning and the substrate having been stored for 20 or more days. That is, the substrate having been stored for 20 or more days had one or more orders of magnitude higher Si content than the substrate immediately after cleaning. Specifically, the Si concentration at the interface in the case of performing epitaxial growth immediately after cleaning was about $1 \times 10^{17}$ atoms/cm$^3$, whereas the Si concentration at the interface in the case of performing epitaxial growth after storage for 20 days was found to be about $10 \times 10^{17}$ atoms/cm$^3$. This is probably the cause of the resistance-value defect. Note that the Si concentration denotes the maximum (peak concentration) of Si concentrations determined at the interface between the epitaxial film and the substrate in the SIMS analysis in which a process of performing etching in the depth direction for a certain distance by sputtering and performing concentration analysis of various elements at the depth is repeated so that Si concentrations in the depth direction from the surface of the epitaxial film to the substrate are analyzed. The maximum (peak concentration) of Si concentrations may become lower than the actual value because the peak shape becomes broad due to roughness of the surface of the epitaxial film or roughness caused by sputtering. Accordingly, Table V describes the peak concentration as well as the integrated concentration (sheet concentration) of Si detected at or near the interface. The integrated concentration of Si detected at or near the interface denotes the number of Si atoms that are present at or near the interface per unit area (cm$^2$) of the epitaxial wafer. Thus, the error of the peak concentration can be compensated for with the integrated concentration.

Based on the above-described findings, an object of the present invention is to provide a compound semiconductor substrate and a surface-treatment method for the compound semiconductor substrate (hereinafter, may be referred to as "cleaning method") in which resistance-value defects do not occur even after the treated substrate is stored for a long period of time. Even when a compound semiconductor substrate according to the present invention is stored for a long period of time and an epitaxial film is then formed thereon, electrical-characteristic defects do not occur.

Solution to Problem

The inventors performed thorough studies on how to achieve the object. As a result, the inventors considered that Si is present, in the air within a clean room, as organic matter in an amount of about 0.5 μg/m$^3$, which is not negligible as molecular contamination; in consideration of the number of molecules of Si-containing organic matter (siloxane) on substrates and storage containers exposed to the atmosphere in which Si-containing organic matter is suspended and the number of molecules of Si-containing organic matter that is left unpurged by nitrogen purge at the time of packing for shipping and remains on the substrates, it is difficult to completely prevent Si-containing organic matter from adhering to the surfaces of compound semiconductor substrates. This was actually investigated and it was difficult to overcome a decrease in the sheet resistance due to adhesion of Si by improving the storage atmosphere and the packing method.

As illustrated in FIG. 2B, siloxane and other organic contaminations 21 adhere to the surface of the substrate 1.

In general, Si-containing organic matter suspended in the atmosphere within a clean room is mainly molecules ranging from trimer (D3) to heptamer (D7) and having a molecular weight of about 200 to about 800. A compound semiconductor substrate immediately after treated with an acid or an alkali has an activated surface and matter suspended in the atmosphere is very likely to adhere to the surface. In particular, regarding Si that is to remain at the interface, Si-containing organic matter probably has a structure suitable for adhesion to the surface.

Since Si-containing organic matter has a relatively high molecular weight of about 200 to about 800, it probably tends to adhere to the surface by replacing molecules that have small mass numbers and have adhered to the surface immediately after cleaning, such as acetone and alcohols.

In addition, since Si-containing organic matter has relatively high heat resistance, Si-containing organic matter present on the substrate surface prior to epitaxial growth is less likely to decompose at the time of thermal cleaning performed within an epitaxial reactor immediately before the epitaxial growth. For this reason, Si-containing organic matter probably tends to remain at the interface between the epitaxial layer and the substrate.

Accordingly, the inventors considered that the occurrence of electrical-characteristic defects can be eliminated in produced HEMTs by forming, before Si-containing organic matter suspended in the atmosphere reaches the surface, a surface layer composed of a substance that is heavier than the Si-containing organic matter, easily adheres to the surface of the compound semiconductor substrate, and can be easily evaporated by heating at the time of the formation of the epitaxial film. The inventors thus thoroughly made many prototypes and, as a result, have found the present invention.

A method for cleaning a compound semiconductor substrate according to the present invention includes cleaning the substrate with, for example, an acid or an alkali, then rinsing the substrate with ultrapure water, drying the substrate, and a final step of subsequently immersing the substrate in a nonionic surfactant and then drying the substrate. It has been found that, in the case of treating a surface of a compound semiconductor substrate that has been cleaned with an acid or an alkali, use of an anionic surfactant provides a substrate surface exhibiting hydrophilicity, whereas use of a nonionic surfactant provides a substrate surface exhibiting hydrophobicity.

Unlike anionic surfactants and cationic surfactants, the hydrophilic groups of nonionic surfactants are not constituted by surfactant molecules each positively or negatively charged, but the hydrophilic groups are formed by formation of hydrogen bonds of water molecules to a moiety that is generally referred to as a hydrophilic group in a surfactant molecule, the moiety having a carbon-oxygen-carbon bond (—C—O—C—). In summary, such a nonionic surfactant has a large number of carbon-oxygen bonds at an end of a long molecule. Since a substrate to which a nonionic surfactant has adhered exhibits hydrophobicity, the substrate surface and the hydrophilic moiety of the nonionic surfactant are probably bonded through hydrogen bonds and bonding stronger than normal adhesion is expected because of the presence of a large number of linking bonds for hydrogen bonds.

The nonionic surfactant preferably has a molecular weight of 700 or more and 2000 or less. Such a surfactant is relatively readily available and hence is industrially advantageous. The treatment is preferably performed under a slightly acidic condition: a pH of 2 or more and 7 or less. Finally, the substrate is immersed in the surfactant and then dried so that, as illustrated in FIG. 2A, a single surfactant layer 20 is formed on the surface of the compound semiconductor substrate 1.

The above-described description describes an example employing a nonionic surfactant. However, the treatment is not necessarily limited to the use of a nonionic surfactant and use of an organic substance having a molecular weight of 700 or more can provide similar advantages. The present invention provides a compound semiconductor substrate at least one major surface of which is mirror-polished, the mirror-polished surface being covered with an organic substance containing hydrogen (H), carbon (C), and oxygen (O).

In a substrate provided by a surface-treatment method according to the present invention, a layer of an organic substance (surfactant) that covers a surface and contains hydrogen (H), carbon (C), and oxygen (O) preferably has a thickness of 1.5 nm or more and 3.0 nm or less. The surfactant is mainly constituted by single bonds and hence is very likely to decompose. Accordingly, the surfactant is readily decomposed and evaporated by heating to 100° C. or more. In the formation of an epitaxial film by MOCVD or the like, heating at 600° C. to 700° C. is generally performed at the initial stage and hence the surfactant is evaporated at this stage; however, to suppress surface roughening upon heating, the heating is preferably performed such that the temperature does not exceed the growth temperature 550° C., which is preferred because the organic-substance layer covering the surface in the present invention easily evaporates at the growth temperature 550° C.

In a surface of a substrate provided by a treatment method according to the present invention, the relative signal intensity of a cation ($CH_3O^+$) having a mass number of 31 in time-of-flight secondary ion mass spectrometry (TOF-SIMS) analysis employing $69Ga^+$ as a primary ion is preferably $2.4 \times 10^{-3}$ or more.

The relative signal intensity of a cation ($C_3H_5O_2^+$) having a mass number of 73 in TOF-SIMS analysis employing $69Ga^+$ as a primary ion is preferably $3.2 \times 10^{-4}$ or more.

The relative intensity of a cation ($CH_3O^+$) having a mass number of 31 in TOF-SIMS analysis employing $69Ga^+$ as a primary ion is preferably 2.0 times or more that of a standard-cleaning compound semiconductor substrate.

The relative intensity of a cation ($C_3H_5O_2^+$) having a mass number of 73 in TOF-SIMS analysis employing $69Ga^+$ as a primary ion is preferably 4.1 times or more that of a standard-cleaning compound semiconductor substrate.

In a surface of a substrate provided by a treatment method according to the present invention, a higher-energy peak is detected at an energy 1.5±0.5 eV higher than 285 eV of a $C_{1s}$ peak by synchrotron radiation X-ray photoelectron spectroscopy (XPS) analysis in which an incident X-ray energy is 365 eV and a photoelectron take-off angle is 90° (photoelectrons taking off in a direction perpendicular to the wafer surface are detected).

The integrated intensity of the higher-energy peak is preferably 0.25 times or more the integrated intensity of the peak at about 285 eV.

A substrate provided by a treatment method according to the present invention is a compound semiconductor substrate at least one major surface of which is mirror-finished, wherein a silicon (Si) content at an interface between an epitaxial film grown at a growth temperature of 550° C. without thermal cleaning performed prior to the growth and the compound semiconductor substrate is, in terms of peak concentration determined by SIMS depth-direction analysis, $2 \times 10^{17}$ atoms/cm$^3$ or less.

Advantageous Effects of Invention

According to the present invention, even when a compound semiconductor substrate is stored for a long period of time and an epitaxial film is then formed thereon, electrical-characteristic defects do not occur.

DESCRIPTION OF EMBODIMENTS

Figure 1:
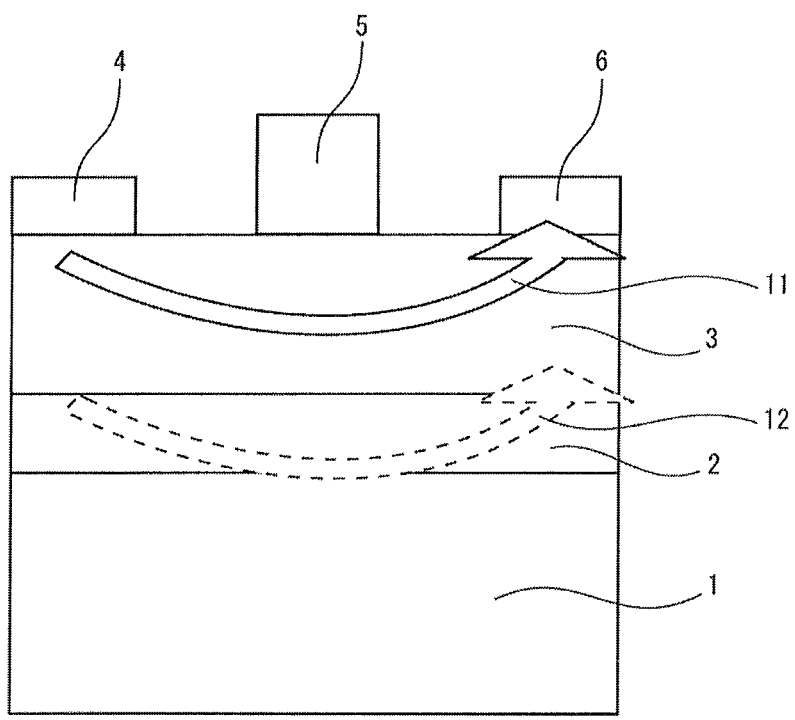
FIG. 1 is an explanatory view of a HEMT.
Figure 2A:
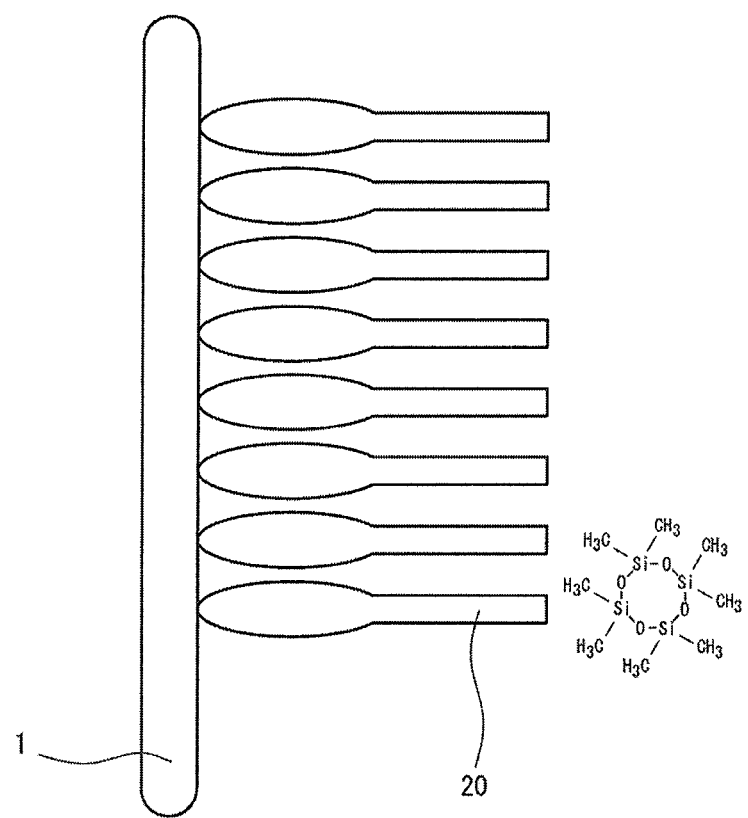
FIG. 2A illustrates a formation of a surfactant layer on the surface of the compound semiconductor substrate.
Figure 2B:
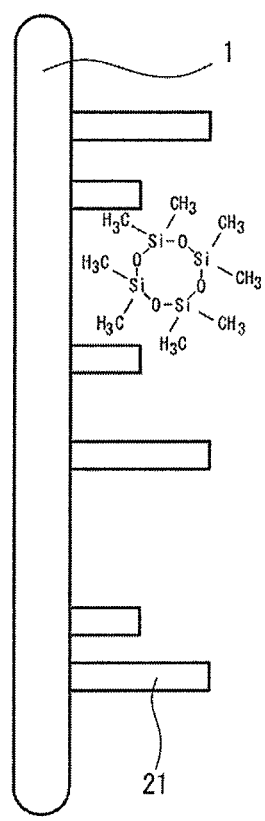
FIG. 2B illustrates a surface contamination model.
Figure 3:
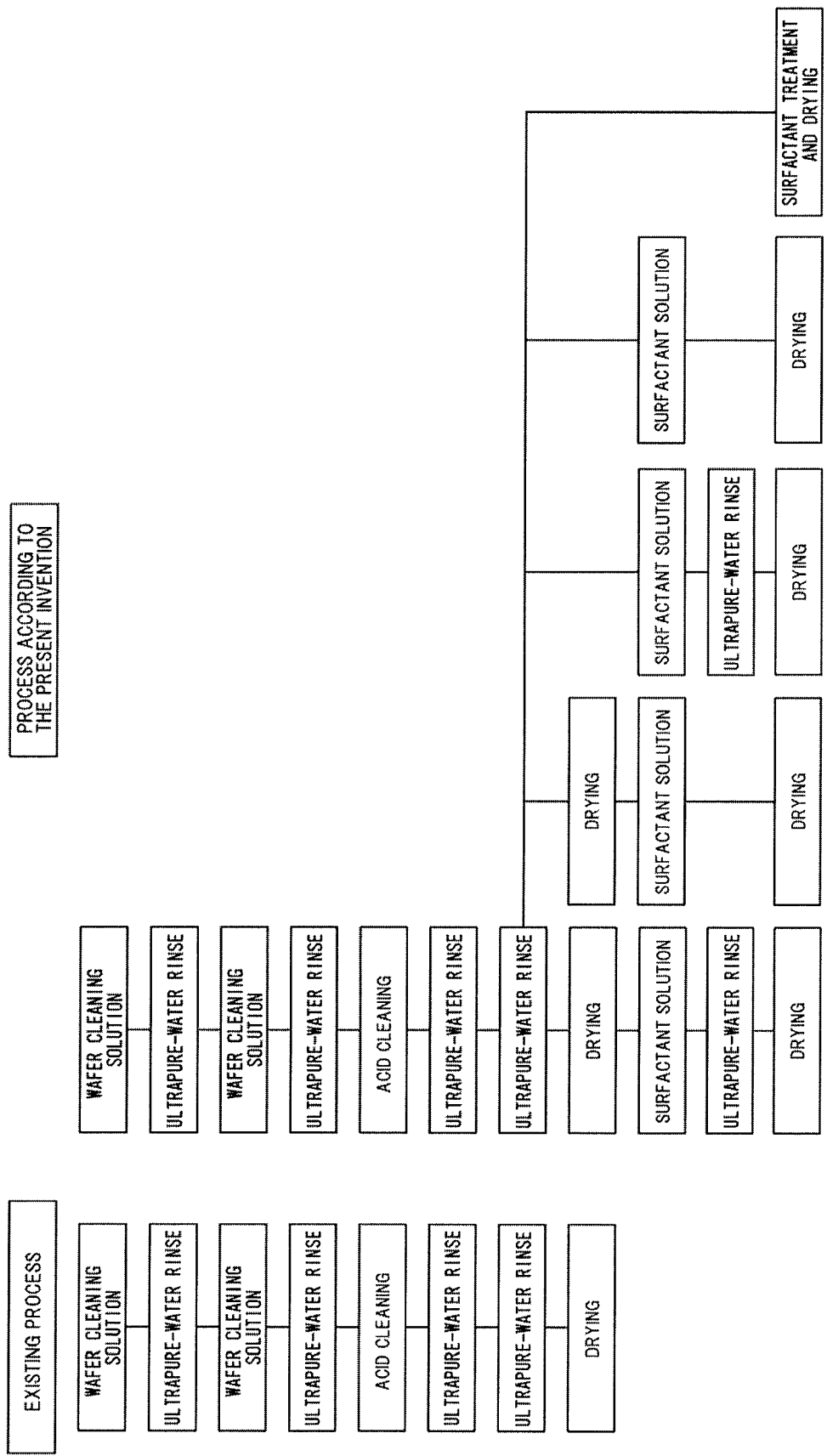
FIG. 3 illustrates an existing surface-treatment process and the process according to the present invention.

A method for cleaning a compound semiconductor substrate according to the present invention includes, in a final step, immersing the substrate into a solution containing an organic substance (nonionic surfactant) containing hydrogen (H), carbon (C), and oxygen (O), and then drying the substrate. The cleaning method before the final step may be performed in the same manner as in an existing process. Typically, as illustrated in FIG. 3, steps are performed: wafer cleaning solution (organic alkaline solution)→ultrapure-water rinse→wafer cleaning solution→ultrapure-water rinse→acid cleaning→ultrapure-water rinse→ultrapure-water rinse→drying; and, finally, surfactant→ultrapure-water rinse and then drying. Alternatively, the intermediate drying may be eliminated and steps may be performed: wafer cleaning solution (organic alkaline solution)→ultrapure-water rinse→wafer cleaning solution→ultrapure-water rinse→acid cleaning→ultrapure-water rinse→ultrapure-water rinse→surfactant→ultrapure-water rinse and then drying.

By using a surfactant aqueous solution having a low concentration, the ultrapure-water rinse after the surfactant treatment may be eliminated. Specifically, steps may be performed: wafer cleaning solution (organic alkaline solution)→ultrapure-water rinse→wafer cleaning solution→ultrapure-water rinse→acid cleaning→ultrapure-water rinse→ultrapure-water rinse→surfactant and then drying. Alternatively, steps may be performed: wafer cleaning solution (organic alkaline solution)→ultrapure-water rinse→wafer cleaning solution→ultrapure-water rinse→acid cleaning→ultrapure-water rinse→ultrapure-water rinse→drying; and, finally, surfactant and then drying.

The cleaning may be performed by arranging cleaning tanks containing a cleaning solution, ultrapure water, and a surfactant, sequentially treating a compound semiconductor substrate with the tanks, and finally drying the substrate by, for example, spin drying utilizing a centrifugal force at the time of a high-speed rotation. Alternatively, single-wafer processing may be employed in which each substrate is rotated while being horizontally held, treated with a surfactant and ultrapure water, and finally dried by high-speed rotation. Alternatively, batch processing may be employed in which substrates are subjected to ultrapure-water rinse, then withdrawn from pure water containing a surfactant, and dried.

The surface state of the thus-cleaned compound semiconductor substrates was analyzed by various methods: one method was TOF-SIMS analysis. A TOF-SIMS apparatus (TRIFII) manufactured by Physical Electronics, Inc. in the U.S. was used to radiate 69Ga$^+$ as a primary ion and positively charged secondary ions were detected with a Time-of-Flight mass spectrometer. The mass-number detection range was 0.5 to 2000. In TOF-SIMS analysis, radiation of Ga$^+$ primary ions causes decomposition of adhesion molecules and molecular species from the decomposition are detected. Accordingly, the detection amount of molecular species having a mass number of 1000 or more was very small.

Relative intensities were compared each of which was determined by defining, as a denominator, the total counts of positively charged secondary ions detected in the mass-number range of 1 to 1000 and by defining, as a numerator, the counts of a target mass number.

As a result, it has been found that, in a substrate in which the content of Si adhering to the surface is low and the sheet resistance is high, a relative signal intensity of a cation ($CH_3O^+$) having a mass number of 31 is $2.4 \times 10^{-3}$ or more; it has also been found that a relative signal intensity of a cation ($C_3H_5O_2^+$) having a mass number of 73 is $3.2 \times 10^{-4}$ or more.

Compound semiconductor substrates having been cleaned by an existing cleaning process (standard cleaning) were similarly subjected to TOF-SIMS analysis. These results were compared with the present invention. The relative signal intensity of a mass number of 31 in the present invention was 2.0 times or more that of the standard-cleaning product. The relative signal intensity of a mass number of 73 in the present invention was 4.1 times or more that of the standard-cleaning product. The "standard-cleaning product" may be a substrate treated by the existing process shown in FIG. 3, for example. Alternatively it may be a substrate treated by the standard cleaning performed in Example 1, described later.

Another analysis method that was XPS analysis employing synchrotron radiation as incident light was performed. When the abscissa axis was calibrated such that the lower-energy peak of $C_{1s}$ was at 285 eV with the incident X-ray energy being 365 eV and the photoelectron take-off angle being 90°, the peak at 285 eV only was detected in the standard-cleaning product, whereas another peak at an energy 1 to 2 eV higher was also detected in a cleaning product according to the present invention.

It has been found that, when the integrated intensity of the peak of the higher-energy is 0.25 times or more the integrated intensity of the peak at 285 eV, the Si adhesion content is low and the sheet resistance is high.

Examples of a nonionic surfactant representing a solution that is used for the surface-treatment and contains an organic substance containing hydrogen (H), carbon (C), and oxygen (O) include higher-alcohol-based surfactants and alkylphenol-based surfactants that have a molecular weight of 700 to 2000, such as polyoxyalkylene alkyl ethers, polyoxyethylene alkyl ethers, and polyoxyethylene alkylphenyl ethers.

The nonionic surfactant may be a fatty-acid-based surfactant. Examples of the fatty-acid-based surfactant include sucrose fatty acid salt/esters, sorbitan fatty acid esters, polyoxyethylene sorbitan fatty acid esters, polyoxyethylene fatty acid esters, and alkanolamides.

The nonionic surfactant preferably has a molecular weight of 700 to 2000. When this molecular weight is low, siloxane suspended in the air has a higher molecular weight and hence the probability of replacement of the surfactant with siloxane having a higher molecular weight increases. When the molecular weight is high, the surfactant is less likely to bond to a surface of a compound semiconductor substrate and hence a film having a desired thickness is less likely to be formed. Accordingly, the optimal molecular weight is 800 to 2000.

The pH of the surfactant solution is preferably in a slightly acidic range. When the solution is strongly acidic, particles tend to adhere to the surface during the treatment. Accordingly, the pH is preferably 2 to 7. The pH can be adjusted with an inorganic acid such as hydrochloric acid or nitric acid, or an organic acid such as citric acid, malic acid, or acetic acid.

The time for which immersion in the surfactant is performed is not particularly limited as long as it is 10 seconds or more. However, immersion for a long time causes economical disadvantages. When the time is less than 10 seconds, the formed surfactant layer does not have a sufficiently large thickness.

An epitaxial film is grown at a growth temperature of 550° C., on a compound semiconductor substrate treated in accordance with the present invention, without high-temperature thermal cleaning performed prior to the growth. The silicon (Si) peak concentration at the interface between the epitaxial film and the compound semiconductor substrate measured by the SIMS analysis is $2 \times 10^{17}$ atoms/cm$^3$ or less.

EXAMPLE 1

GaAs substrates were prepared. Each GaAs substrate was produced by the vertical Bridgman (VB) method (vertical boat method); the carbon doping amount was $1 \times 10^{15}$ to $2 \times 10^{16}$/cm$^3$; the oxygen content of the crystal was $5 \times 10^{16}$ to $5 \times 10^{17}$/cm$^3$; the crystal defect etch pit density (EPD) was 1000/cm$^2$ or less; the substrate was a semi-insulating substrate having a resistivity of $1 \times 10^7$ Ωcm to $6 \times 10^8$ Ωcm; and the diameter was 4 inches.

As for the plane orientation of the substrate, a (100) 2°-off substrate (plane-orientation tolerance: ±0.5°) that is generally used for MOCVD epitaxial in electron device applications was used. Substrates that are oriented off (100) such as (100) ±0.5° substrates and (100) 0.05° to 2°-off substrates are used as substrates for MOCVD in accordance with MOCVD conditions and device performance; and a treatment with a nonionic surfactant according to the present invention can provide similar advantages to any of the substrates.

When the crystal is a polycrystal, impurities concentrate along grain boundaries. When a device is formed on such a polycrystal, current may flow through the grain boundaries. Accordingly, the crystal needs to be a single crystal. When a substrate has a resistivity of less than $1 \times 10^7$ Ωcm, upon application of a voltage, current leaks beyond a high-purity GaAs layer having a thickness of about 1 μm to the substrate. Accordingly, in an epitaxial substrate for a HEMT, the resistivity of the substrate is also important and needs to be $1 \times 10^7$ Ωcm or more.

On the other hand, although a heterojunction bipolar transistor (HBT) is an example of GaAs high-speed devices, an n-type collector layer having a concentration of about $1 \times 10^{18}$ atoms/cm$^3$ is formed on a semi-insulating substrate. Accordingly, even the presence of impurities of about $1 \times 10^{18}$ atoms/cm$^3$ at the substrate interface does not cause problems.

Surfaces of the GaAs substrates were mirror-polished and the substrates were then subjected to standard cleaning.

Figure 4:
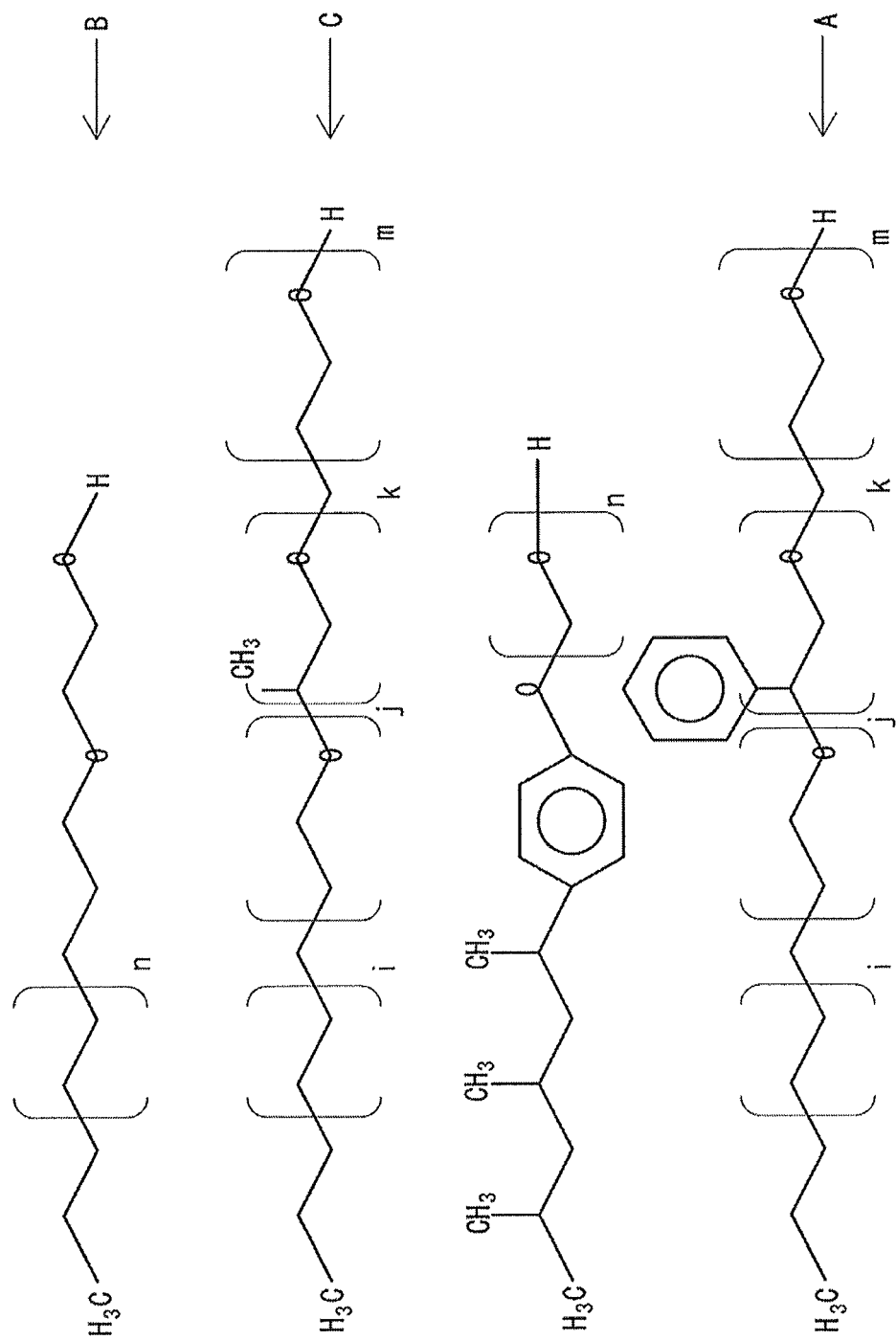
FIG. 4 illustrates examples of a nonionic surfactant.

Referring to as FIG. 4, by using a batch cleaning apparatus, the substrates were subsequently immersed in 0.1 to 3 vol % aqueous solutions of a nonionic surfactant A having a molecular weight of 700 to 900, a nonionic surfactant B having a molecular weight of 800 to 1200, and a nonionic surfactant C having a molecular weight of 800 to 1000 (polyoxyalkylene alkyl ethers) for 5 to 120 seconds (treatment time), then appropriately rinsed with ultrapure water for the predetermined time (rinse time (seconds)), and subsequently subjected to spin-drying. The substrates having been immersed in the surfactants and the substrates that were not immersed in the surfactants were placed in standard wafer trays, subjected to nitrogen purging, and then sealed and stored in clean bags impermeable to oxygen and moisture by the same storage method at the same storage location. The wafer trays and the bags used did not contain organic Si compounds (siloxane) (siloxane outgassing amount was less than 0.01 µg/g). Outgassing analysis of the wafer trays and the bags was performed in the following manner: the wafer trays and the bags were finely cut and then heated to 40° C. and generated substances were analyzed with a gas chromatograph-mass spectrometer (GC-MS).

The standard cleaning performed herein was a general cleaning process performed after mirror-polishing of surfaces. Specifically, the following process was employed:
(1) immersion in a 0.5 vol % aqueous solution of tetramethylammonium hydroxide for 5 minutes at room temperature (25° C.)
(2) ultrapure-water rinse for 3 minutes
(3) immersion in a 0.5 vol % aqueous solution of tetramethylammonium hydroxide for 5 minutes at room temperature (25° C.)
(4) ultrapure-water rinse for 3 minutes
(5) immersion in a nitric acid acidic aqueous solution having a pH of 5 for 3 minutes at room temperature (25° C.)
(6) ultrapure-water rinse for 3 minutes (twice)
(7) spin drying Alternatively, another cleaning process that is generally known may be used.

Immediately after the drying, the thickness of the surfactant layer was measured. The thickness of the surfactant layer can be measured with an ellipsometer (RUDOLPH AUTO ELIV). As for parameters of the ellipsometer, the measurement light wavelength was 632.8 nm; the substrate refractive index was 3.857; the substrate extinction coefficient was 0.217; the refractive index of the surfactant layer was fixed at 1.8 for convenience of calculation. In the substrate surface having the surfactant layer, a natural oxide film layer of the substrate underlies the surfactant layer. The natural oxide film layer has a thickness of about 0.7 nm. It is very difficult for an ellipsometer to individually determine the small thickness of the natural oxide film and the small thickness of the surfactant layer overlying the natural oxide film through measurement and analysis in terms of accuracy. Accordingly, in the present invention, the thickness of a film (layer) including both the natural oxide film and the surfactant layer is determined as a "film thickness". In the cases of not using surfactants, the film thickness of the surfactant layer denotes the thickness of the natural oxide film.

After being stored for 20 days, each substrate was taken out from the sealed bag and an epitaxial film was formed on the substrate by MOCVD. This epitaxial growth was performed with a general-purpose MOCVD reactor, without high-temperature thermal cleaning performed prior to the growth, to form an undoped 1-µm GaAs epitaxial film at a growth temperature of 550° C. The sheet resistance of each substrate was then measured. In addition, the Si content at the interface between the undoped epitaxial film (epi-film) and the substrate was measured with SIMS. The results are described in Table I.

TABLE I

| No | Surfactant | Concentration (%) | pH | Treatment time (s) | Rinse time (s) | Film thickness of surfactant layer immediately after cleaning (nm) | Si peak concentration at epi-film/substrate interface ($\times 10^{17}$ atoms/cm$^3$) | Post-epi sheet resistance ($\times 10^3$ Ω/□) |
|---|---|---|---|---|---|---|---|---|
| 1 | A | 0.1 | 6 | 5 | 0 | 1.43 | 3.00 | 5.6 |
| 2 | A | 0.1 | 5 | 10 | 0 | 1.66 | 0.68 | 80.0 |
| 3 | B | 0.1 | 5 | 5 | 0 | 1.16 | 5.20 | 7.6 |
| 4 | B | 0.1 | 5 | 120 | 0 | 1.34 | 1.00 | 58.0 |
| 5 | B | 0.5 | 5 | 120 | 60 | 1.53 | 1.00 | 98.0 |
| 6 | C | 0.5 | 5 | 120 | 60 | 1.30 | 1.20 | 38.0 |
| 7 | C | 0.5 | 2 | 120 | 60 | 1.79 | 0.62 | 300.0 |
| 8 | C | 0.5 | 2 | 120 | 60 | 1.70 | 0.70 | 170.0 |
| 9 | C | 0.1 | 2 | 60 | 60 | 1.11 | 1.60 | 9.8 |
| 10 | C | 0.1 | 2 | 120 | 60 | 1.21 | 1.60 | 20.0 |
| 11 | C | 3.0 | 4 | 120 | 0 | 5.33 | 0.8 | 98.0 |
| 12 | C | 3.0 | 4 | 120 | 0 | 4.36 | 0.5 | 98.0 |
| 13 | C | 0.1 | 2 | 120 | 60 | 1.65 | 0.68 | 170.0 |
| 14 | C | 0.1 | 5 | 120 | 5 | 1.54 | 0.84 | 120.0 |
| 15 | C | 0.1 | 6 | 120 | 180 | 1.69 | 0.80 | 100.0 |
| 16 | C | 1.0 | 2 | 120 | 5 | 2.66 | 0.50 | 250.0 |
| 17 | C | 1.0 | 4 | 120 | 180 | 1.90 | 0.80 | 200.0 |
| 18 | C | 1.0 | 4 | 120 | 60 | 1.54 | 1.00 | 48.0 |
| 19 | C | 3.0 | 4 | 120 | 0 | 5.20 | 0.18 | 370.0 |
| 20 | C | 3.0 | 3 | 120 | 60 | 1.20 | 1.50 | 20.0 |
| 21 | C | 3.0 | 2 | 120 | 180 | 1.47 | 1.00 | 50.0 |
| 22 | C | 3.0 | 4 | 120 | 60 | 2.08 | 1.00 | 56.0 |
| 23 | C | 3.0 | 4 | 120 | 5 | 5.33 | 0.80 | 270.0 |
| 24 | None | — | — | — | — | 0.85 | 7.50 | 4.0 |
| 25 | None | — | — | — | — | 0.71 | 7.20 | 4.8 |
| 26 | None | — | — | — | — | 0.79 | 4.80 | 5.6 |

TABLE I-continued

| No | Surfactant | Concentration (%) | pH | Treatment time (s) | Rinse time (s) | Film thickness of surfactant layer immediately after cleaning (nm) | Si peak concentration at epi-film/substrate interface (×10$^{17}$ atoms/cm$^3$) | Post-epi sheet resistance (×10$^3$ Ω/□) |
|---|---|---|---|---|---|---|---|---|
| 27 | None | — | — | — | — | 0.81 | 8.80 | 3.6 |
| 28 | None | — | — | — | — | 0.80 | 5.00 | 5.4 |

As indicated in Table I, among the substrates immersed in the surfactants, the substrates in which the thickness of the surfactant layer exceeded 1.50 nm had a high sheet resistance of 10.0×10$^3$Ω/□ or more. Existing products that were not immersed in the surfactants had a low sheet resistance of 5.6×10$^3$Ω/□ or less.

The Si content at the interface between the epitaxial film and the substrate was measured with SIMS. As a result, among the substrates immersed in the surfactants, the substrates in which the thickness of the surfactant layer, as the film thickness, exceeded 1.50 nm had a peak concentration of 2.0×10$^{17}$ atoms/cm$^3$ or less, which was very low contamination; some of the existing products that were not immersed in the surfactants had a concentration that considerably exceeded 5×10$^{17}$ atoms/cm$^3$. Thus, there was a clear difference.

When the thickness of the surfactant layer, as the film thickness, was less than 1.5 nm, the Si content at the interface between the epitaxial film and the substrate was not considerably decreased with respect to the existing products and the sheet resistance did not become very high; thus, the effect of the surfactant layer did not sufficiently provided. On the other hand, when the film thickness was 1.5 nm or more, the sheet resistance became sufficiently high. However, when the film thickness exceeded 3.0 nm, the surface of the substrate prior to epitaxial growth had white cloudiness or the resultant epitaxial film had surface irregularities because the thick surfactant layer was less likely to evaporate during heating to the epitaxial-growth temperature. Accordingly, the thickness of the surfactant layer, as the film thickness, is preferably 1.5 nm or more and 3.0 nm or less; in particular, 1.5 nm to 2.0 nm is preferred because Si contamination is low and the probability of contamination due to remaining of carbon and oxygen at the interface caused by insufficient decomposition (evaporation) of the film during epitaxial growth is very low.

The thickness of the surfactant layer can be easily measured with an ellipsometer and, on the basis of the thickness, the Si content at the interface after epitaxial growth can be estimated. Accordingly, the quality control of the substrates can be performed with more certainty. When a compound semiconductor substrate is subjected to standard cleaning, the natural oxide film on the substrate surface remains unstable immediately after the cleaning; after about a week elapses, the oxide film becomes stable and, during this period, the film thickness on the substrate surface increases by about 0.3 nm. In a substrate in which a surfactant layer is formed as in the present invention, the film thickness also increases by about 0.3 nm after a week elapses with respect to the film thickness immediately after the application of the surfactant.

The surfaces of other substrates that were cleaned and stored in the same manner as in Nos. 16, 17, 19, 20, 27, and 28 in Table I were subjected to TOF-SIMS analysis. For each case, two substrates were analyzed.

Figure 5:
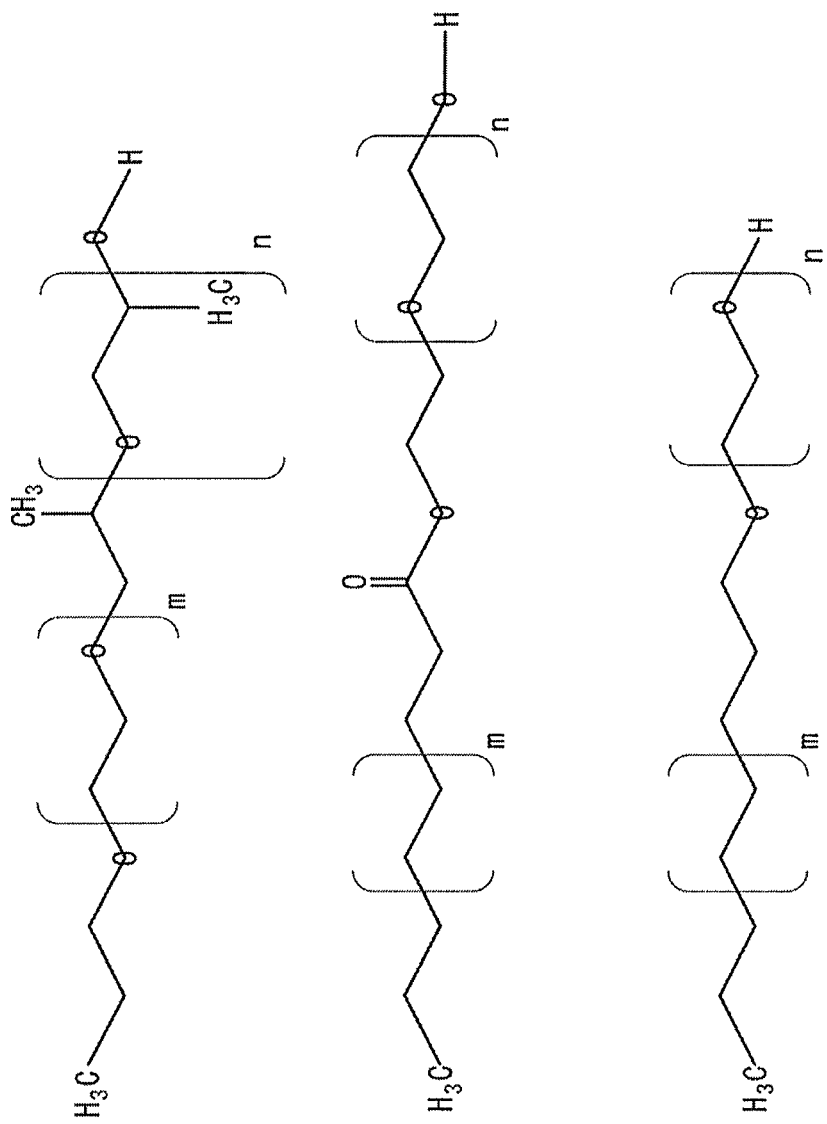
FIG. 5 illustrates other examples of a nonionic surfactant.

The TOF-SIMS analysis detected cations having a mass number listed in Table II. The counts of detected ions are described in Table II. In the products of the present invention, the surfaces of the substrates are covered with the surfactants exemplified in FIG. 5. However, in the results by the TOF-SIMS analysis, original ions having a high molecular weight as illustrated in FIG. 5 were not detected and a plurality of organic ions constituted by C, H, and O were detected. This is probably because 69Ga$^+$ radiated as a primary ion at the time of measurement partially broke bonds of the surfactants on the surfaces.

Relative intensities are described in Table III, the relative intensities being determined by defining, as a denominator, the total counts of ion species that were detected in the mass-number range of 1 to 1000 and also included ion species having low counts and not described in Table II, and by defining, as a numerator, the counts of a target ion.

TABLE II

| Mass | Formula | No. 27 | No. 16 | No. 19 | No. 17 |
|---|---|---|---|---|---|
| 24 | Mg+ | 139 | 25 | 23 | 36 |
| 40 | Ca+ | 1898 | 17 | 12 | 89 |
| 63 | Cu+ | 142 | 89 | 22 | 29 |
| 15 | CH3+ | 7788 | 17313 | 14114 | 15629 |
| 27 | C2H3+ | 22409 | 43735 | 48922 | 50042 |
| 41 | C3H5+ | 23502 | 40250 | 79300 | 42664 |
| 77 | C6H5+ | 1277 | 556 | 506 | 4531 |
| 91 | C7H7+ | 1074 | 517 | 290 | 7568 |
| 219 | C15H23O+ | 717 | 61 | 35 | 349 |
| 31 | CH3O+ | 4086 | 15621 | 20163 | 12367 |
| 45 | C2H5O+ | 5192 | 54394 | 84545 | 59906 |
| 59 | C3H7O+ | 2345 | 16886 | 48663 | 3135 |
| 73 | C3H5O2+ | 260 | 3534 | 13107 | 3500 |
| 87 | C4H7O2+ | 88 | 2342 | 11379 | 2338 |
| 101 | C5H9O2+ | 127 | 553 | 3719 | 192 |
| 115 | C6H11O2+ | 166 | 357 | 2474 | 724 |
| 387 | 387+ | 6 | 25 | 80 | 10 |
| 457 | 457+ | 7 | 20 | 87 | 6 |
| 545 | 545+ | 3 | 17 | 81 | 6 |
| 603 | 603+ | 0 | 10 | 41 | 3 |
| 607 | 607+ | 1 | 9 | 41 | 2 |
| 633 | 633+ | 1 | 17 | 57 | 4 |
| 18 | NH4+ | 24430 | 20511 | 27 | 22121 |
| 44 | C2H6N+ | 4217 | 1198 | 606 | 1187 |
| 46 | C2H8N+ | 8214 | 1977 | 339 | 1103 |
| 60 | C3H10N+ | 11634 | 242 | 291 | 125 |
| 75 | As+ | 16058 | 15248 | 6359 | 16879 |
| 160 | GaAsO+ | 1527 | 1015 | 86 | 893 |
| 177 | GaAsO2H+ | 1036 | 848 | 106 | 675 |
| 245 | Ga2AsO2+ | 267 | 195 | 24 | 156 |
| 261 | Ga2AsO3+ | 206 | 220 | 15 | 137 |
| 283 | GaAs2O4+ | 349 | 223 | 33 | 290 |
| 71 | 71Ga+ | 1115706 | 1075931 | 521937 | 1158196 |
| Total | Total+ | 3314251 | 3395792 | 2442924 | 3800407 |

TABLE III

| Normalize | Mass | Formula | No. 27 | No. 16 | No. 19 | No. 17 |
|---|---|---|---|---|---|---|
| Total+ | 24 | Mg+ | 4.19E−05 | 7.36E−06 | 9.41E−06 | 9.47E−06 |
| Total+ | 40 | Ca+ | 5.73E−04 | 5.01E−06 | 4.91E−06 | 2.34E−05 |
| Total+ | 63 | Cu+ | 4.28E−05 | 2.62E−05 | 9.01E−06 | 7.63E−06 |
| Total+ | 15 | CH3+ | 2.35E−03 | 5.10E−03 | 5.78E−03 | 4.11E−03 |
| Total+ | 27 | C2H3+ | 6.76E−03 | 1.29E−02 | 2.00E−02 | 1.32E−02 |
| Total+ | 41 | C3H5+ | 7.09E−03 | 1.19E−02 | 3.25E−02 | 1.12E−02 |
| Total+ | 77 | C6H5+ | 3.85E−04 | 1.64E−04 | 2.07E−04 | 1.19E−03 |
| Total+ | 91 | C7H7+ | 3.24E−04 | 1.52E−04 | 1.19E−04 | 1.99E−03 |
| Total+ | 219 | C15H23O+ | 2.16E−04 | 1.80E−05 | 1.43E−05 | 9.18E−05 |
| Total+ | 31 | CH3O+ | 1.23E−03 | 4.60E−03 | 8.25E−03 | 3.25E−03 |
| Total+ | 45 | C2H5O+ | 1.57E−03 | 1.60E−02 | 3.46E−02 | 1.58E−02 |
| Total+ | 59 | C3H7O+ | 7.08E−04 | 4.97E−03 | 1.99E−02 | 8.25E−04 |
| Total+ | 73 | C3H5O2+ | 7.84E−05 | 1.04E−03 | 5.37E−03 | 9.21E−04 |
| Total+ | 87 | C4H7O2+ | 2.66E−05 | 6.90E−04 | 4.66E−03 | 6.15E−04 |
| Total+ | 101 | C5H9O2+ | 3.83E−05 | 1.63E−04 | 1.52E−03 | 5.05E−05 |
| Total+ | 115 | C6H11O2+ | 5.01E−05 | 1.05E−04 | 1.01E−03 | 1.91E−04 |
| Total+ | 387 | 387+ | 1.81E−06 | 7.36E−06 | 3.27E−05 | 2.63E−06 |
| Total+ | 457 | 457+ | 2.11E−06 | 5.89E−06 | 3.56E−05 | 1.58E−06 |
| Total+ | 545 | 545+ | 9.05E−07 | 5.01E−06 | 3.32E−05 | 1.58E−06 |
| Total+ | 603 | 603+ | — | 2.94E−06 | 1.68E−05 | 7.89E−07 |
| Total+ | 607 | 607+ | 3.02E−07 | 2.65E−06 | 1.68E−05 | 5.26E−07 |
| Total+ | 633 | 633+ | 3.02E−07 | 5.01E−06 | 2.33E−05 | 1.05E−06 |
| Total+ | 18 | NH4+ | 7.37E−03 | 6.04E−03 | 1.11E−05 | 5.82E−03 |
| Total+ | 44 | C2H6N+ | 1.27E−03 | 3.53E−04 | 2.48E−04 | 3.12E−04 |
| Total+ | 46 | C2H8N+ | 2.48E−03 | 5.82E−04 | 1.39E−04 | 2.90E−04 |
| Total+ | 60 | C3H10N+ | 3.51E−03 | 7.13E−05 | 1.19E−04 | 3.29E−05 |
| Total+ | 75 | As+ | 4.85E−03 | 4.49E−03 | 2.60E−03 | 4.44E−03 |
| Total+ | 160 | GaAsO+ | 4.61E−04 | 2.99E−05 | 3.52E−05 | 2.35E−04 |
| Total+ | 177 | GaAsO2H+ | 3.13E−04 | 2.50E−04 | 4.34E−05 | 1.78E−04 |
| Total+ | 245 | Ga2AsO2+ | 8.06E−05 | 5.74E−05 | 9.82E−06 | 4.10E−05 |
| Total+ | 261 | Ga2AsO3+ | 6.22E−05 | 6.48E−05 | 6.14E−06 | 3.60E−05 |
| Total+ | 283 | GaAs2O4+ | 1.05E−04 | 6.57E−05 | 1.35E−05 | 7.63E−05 |
| Total+ | 71 | 71Ga+ | 3.37E−01 | 3.17E−01 | 2.14E−01 | 3.05E−01 |

Figure 6:
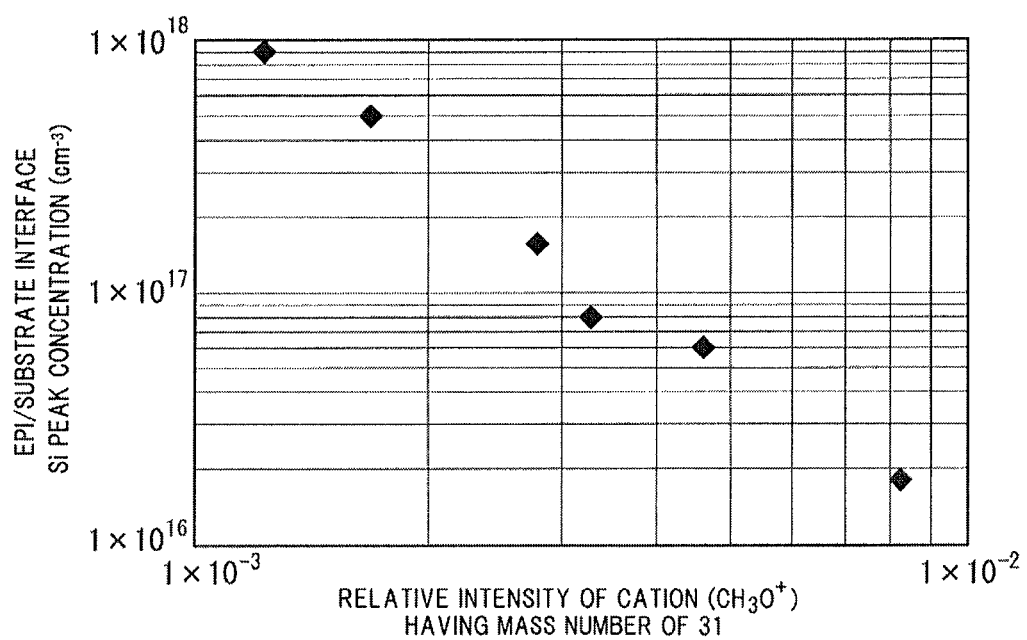
FIG. 6 illustrates the relationship between the relative intensity of a cation ($CH_3O^+$) having a mass number of 31 and the interface Si peak concentration.
Figure 7:
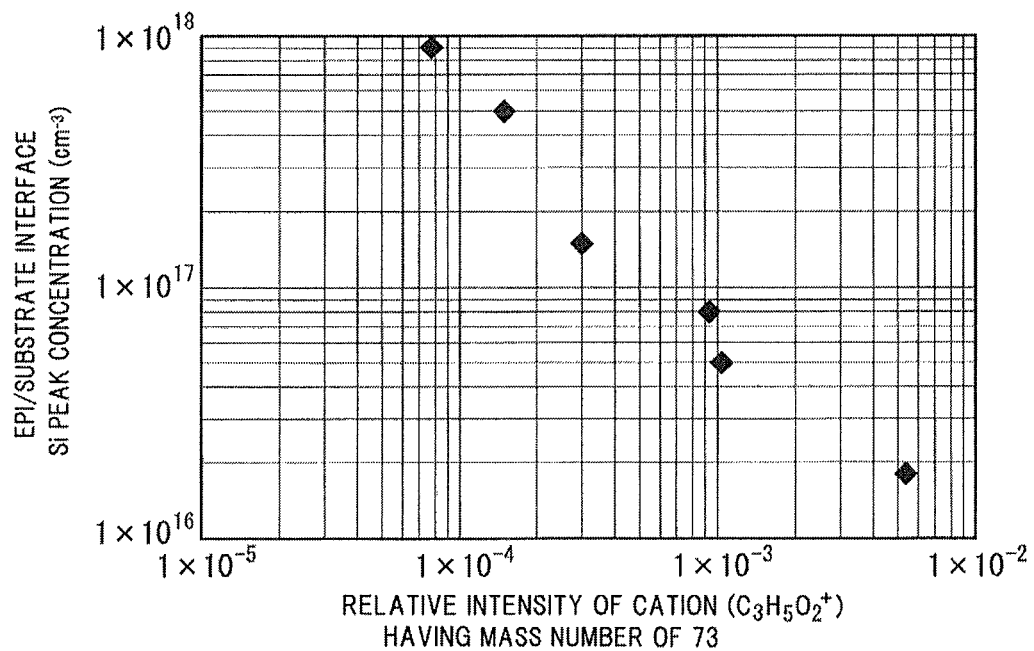
FIG. 7 illustrates the relationship between the relative intensity of a cation ($C_3H_5O_2^+$) having a mass number of 73 and the interface Si peak concentration.

Based on the results of the TOF-SIMS analysis, the relationships between relative intensity detected at a mass number of an organic ion constituted by C, H, and O and the surface Si content (Si peak concentration at epi-film/substrate interface) are illustrated in FIGS. 6 and 7.

Table III indicates that the detection amount of organic substances containing H, C, and O is large in the products of the present invention. For example, from FIG. 6, the Si peak concentration in the surface becomes $2 \times 10^{17}$ or less when the relative signal intensity at a mass number of 31 is $2.4 \times 10^{-3}$ or more; from FIG. 7, it is when the relative signal intensity at a mass number of 73 is $3.2 \times 10^{-4}$ or more.

Comparison between the products of the present invention and the standard-cleaning products indicates that the Si peak concentration becomes $2 \times 10^{17}$ or less when the relative signal intensity at a mass number of 31 is 2.0 times or more that of the standard-cleaning product (No. 27); and, for the signal at a mass number of 73, it is 4.1 times or more. In the case of standard cleaning, the surface is not covered with long C chains and hence does not have resistance to siloxane; relative signal intensities at mass numbers such as 31 and 73 by TOF-SIMS are substantially similar low values; and the interface Si content varies quickly in response to variations in siloxane in the atmosphere.

In addition, other substrates that were cleaned and stored in the same manner as in Nos. 16, 17, and 27 (standard-cleaning product) were subjected to synchrotron radiation XPS analysis. The analysis was performed in which a beam line (BL12) in Kyushu Synchrotron Light Research Center was used as a light source, the incident X-ray energy was 365 eV, the pass energy was 11.75 eV, and the emission electron take-off angle was 90°.

Figure 8:
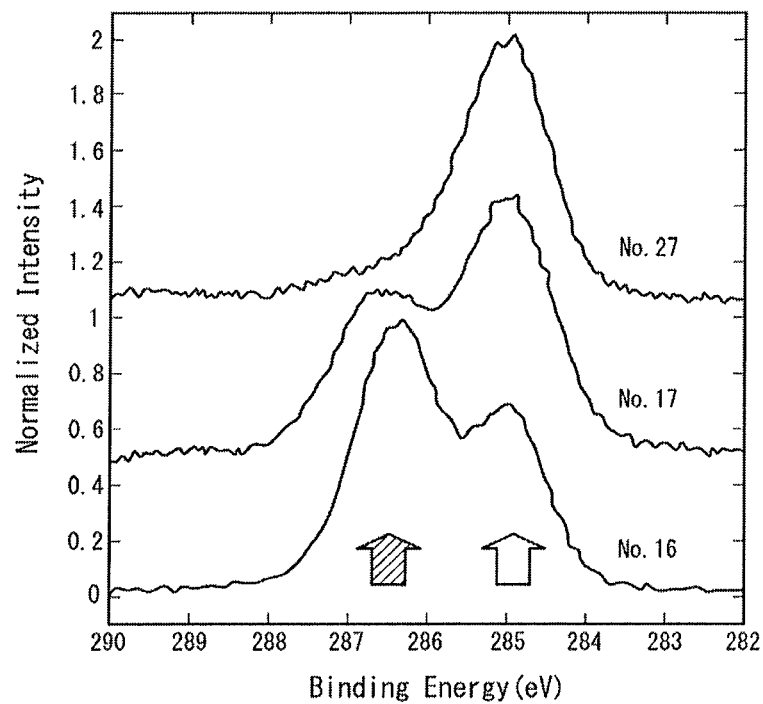
FIG. 8 illustrates examples of a synchrotron radiation XPS spectrum.
Figure 9:
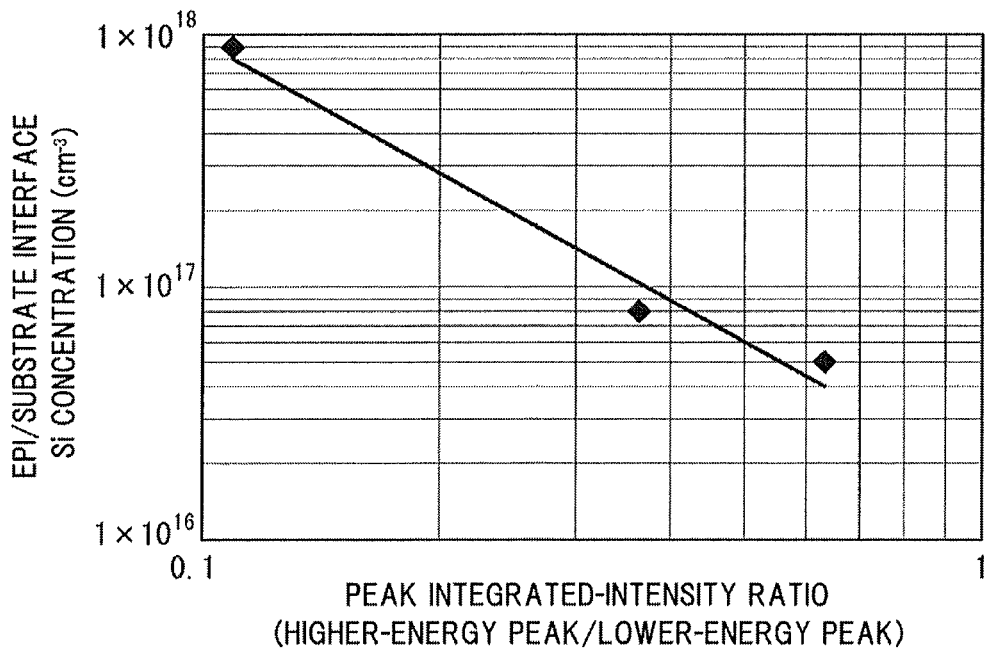
FIG. 9 illustrates the relationship between the integrated intensity calculated from synchrotron radiation XPS measurement and the interface Si concentration.

XPS spectra are collectively illustrated in FIG. 8. The products of the present invention have a higher-energy peak at an energy 1 to 2 eV higher than the peak of C1s at 285 eV. The lower the Si content of a substrate, the taller the higher-energy peak becomes. From the spectra, the integrated intensity of the peak at 285 eV is compared with the integrated intensity of the higher-energy peak. Thus, FIG. 9 indicates that, to make the Si peak concentration be $2 \times 10^{17}$ or less, the integrated intensity of the peak of the higher-energy is 0.25 times or more the integrated intensity of the peak at 285 eV.

EXAMPLE 2

GaAs substrates were prepared. Each GaAs substrate was produced by the vertical gradient freezing (VGF) method (vertical boat method); the carbon doping amount was $1 \times 10^{15}$ to $2 \times 10^{16}/cm^3$; the oxygen content of the crystal was $5 \times 10^{15}$ to $5 \times 10^{16}/cm^3$; the crystal defect EPD (etch pit density) was $500/cm^2$ or less; the substrate was a semi-insulating substrate having a resistivity of $1 \times 10^7$ to $1 \times 10^8$ Ωcm; and the diameter was 6 inches. As for the plane orientation of the substrate, a (100) 2°-off substrate (plane-orientation tolerance: ±0.5°) was used.

Surfaces of the GaAs substrates were mirror-polished. The substrates were then subjected to batch cleaning using a standard-cleaning solution as in Example 1 and temporarily dried. Each substrate was then processed with a single-wafer processing equipment: the substrates were spin-coated with 0.35 to 5 vol % solutions prepared by diluting a 30 vol % aqueous solution of a nonionic surfactant (polyoxyalkylene alkyl ether) having a molecular weight of 800 to 1000, at a rotation rate of 200 to 1000 rpm for 10 to 60 seconds, and then dried at a high rotation rate of 2000 rpm for 35 seconds.

In the case of single-wafer coating, the front surface is coated with an aqueous solution of the nonionic surfactant; when the aqueous solution reaches the back surface, cloudiness of the back surface may be caused. Accordingly, the back surface was rinsed with ultrapure water. In addition, at the time of drying, to facilitate drying of the back surface, nitrogen was sprayed to the back surface to promote the drying. After that, the thickness of the surfactant layer was measured with an ellipsometer as in Example 1.

The substrates were placed in clean PP (polypropylene) wafer trays, subjected to nitrogen purging, and then sealed and stored in clean bags impermeable to oxygen and moisture by the same storage method at the same storage location as in Example 1.

After being stored for 20 days, each substrate was taken out from the sealed bag and an undoped 1-μm GaAs epitaxial film was formed on the substrate by MOCVD as in Example 1. After the epitaxial film was formed, the sheet resistance of each substrate was measured. In addition, the Si content at the interface between the epitaxial film and the substrate was measured with SIMS. The results are described in Table IV.

Surfaces of the GaAs substrates were processed so as to become mirror surfaces. The substrates were then subjected to batch cleaning using a standard-cleaning solution and, at the time of drying, drip-drying was performed. Specifically, the treatment was performed in accordance with the following flow: wafer cleaning solution (organic alkaline solution) →ultrapure-water rinse→wafer cleaning solution→ultrapure-water rinse→acid cleaning→ultrapure-water rinse→ultrapure-water rinse→drip-drying (surfactant treatment). The cleaning with the standard-cleaning solution was performed as in Example 1 except that the organic alkaline solution was tetramethyl ammonium hydroxide and the acid cleaning was performed with 0.1% hydrochloric acid.

The drip-drying was performed in the following manner. A 30 vol % aqueous solution of a nonionic surfactant having a molecular weight of 800 to 1100 (polyoxyethylene nonylphenyl ether) was diluted into 0.5% solution and used. The upper atmosphere of the dryer was purged with high-purity nitro-

TABLE IV

| Surfactant | | | | Film thickness of layer immediately after cleaning (nm) | Si peak concentration at epi-film/substrate interface ($\times 10^{17}$ atoms/cm$^3$) | Post-epi sheet resistance ($\times 10^3$ Ω/□) |
|---|---|---|---|---|---|---|
| Concentration (%) | pH | Rotation rate (rpm) | Time (s) | | | |
| 0.105 | 6 | 200 | 10 | 1.49 | 1.2 | 21 |
| 0.105 | 6 | 200 | 15 | 1.80 | 2.0 | 16 |
| 0.105 | 6 | 200 | 60 | 1.81 | 0.81 | 42 |
| 0.105 | 6 | 200 | 60 | 2.24 | 0.98 | 86 |
| 0.105 | 6 | 200 | 60 | 2.03 | 0.84 | 91 |
| 0.105 | 6 | 200 | 60 | 2.36 | 0.36 | 200 |
| 0.15 | 6 | 200 | 15 | 2.13 | 0.45 | 110 |
| 0.15 | 6 | 200 | 15 | 2.19 | 0.58 | 190 |
| 0.9 | 5 | 200 | 15 | 2.81 | 0.49 | 220 |
| 1.5 | 5 | 200 | 15 | 3.04 | 0.58 | 190 |
| 1.5 | 5 | 200 | 15 | 2.85 | 0.53 | 230 |
| 0.105 | 6 | 500 | 15 | 1.58 | 1.1 | 11 |
| 0.105 | 6 | 500 | 15 | 1.84 | 0.63 | 110 |
| 0.15 | 6 | 500 | 15 | 2.28 | 0.89 | 78 |
| 0.15 | 6 | 500 | 15 | 2.31 | 0.60 | 200 |
| 0.105 | 6 | 1000 | 15 | 1.73 | 0.95 | 50 |
| 0.105 | 6 | 1000 | 15 | 1.59 | 1.3 | 15 |
| 0.105 | 6 | 1000 | 15 | 1.89 | 1.3 | 12 |
| 0.105 | 6 | 1000 | 15 | 2.01 | 0.55 | 150 |
| 0.105 | 6 | 1000 | 15 | 1.91 | 0.43 | 180 |
| 0.105 | 6 | 1000 | 15 | 2.01 | 0.98 | 130 |
| 0.3 | 5 | 1000 | 15 | 2.31 | 0.81 | 140 |
| 0.6 | 5 | 1000 | 15 | 2.53 | 0.53 | 250 |
| 0.9 | 5 | 1000 | 15 | 2.55 | 0.67 | 150 |

Table IV indicates that, even in the cases of single-wafer coating with a surfactant, the sheet resistance was a high value of $10 \times 10^3$ Ω/□ or more and the Si peak concentration at the interface was $2 \times 10^{17}$ atoms/cm$^3$ or less. The film thickness of the surfactant layer immediately after cleaning ranges from 1.5 nm to 3.0 nm in one significant figure.

EXAMPLE 3

GaAs substrates were prepared. Each GaAs substrate was produced by the VGF method (vertical boat method); the carbon doping amount was $1 \times 10^{15}$ to $2 \times 10^{16}$/cm$^3$; the substrate was a semi-insulating substrate having a resistivity of $1 \times 10^7$ to $5 \times 10^8$ Ωcm; and the diameter was 6 inches. As for the plane orientation of the substrate, a (100) 2°-off substrate (plane-orientation tolerance: ±0.3°) was used.

gen. The compound semiconductor substrates were immersed in a drying tank containing the above-described aqueous solution for 2 minutes and were then withdrawn slowly at a constant rate and dried. Specifically, at the time of withdrawal drying, films of the nonionic surfactant were formed on the surfaces of the compound semiconductor substrates and the hydrophilic groups (moieties that form hydrogen bonds) of the nonionic surfactant form hydrogen bonds with the substrate surfaces; thus, hydrophobic groups of the nonionic surfactant are arranged on the substrate surfaces and hence the substrate surfaces exhibit hydrophobicity. Accordingly, as soon as the substrates are withdrawn from the aqueous solution to the nitrogen atmosphere, water has dripped from the substrate surfaces. Thus, by continuously raising the substrates slowly, surfactant layers are formed on the substrate surfaces while the substrate surfaces are dried. A surfactant layer on such a treated substrate surface had a thickness of, as the film thickness measured with an ellipsometer, 2.0 nm.

The substrates were placed in clean PP (polypropylene) wafer trays, subjected to nitrogen purging, and then sealed and stored in clean bags impermeable to oxygen and moisture by the same storage method at the same storage location as in Example 1.

After being stored for 20 days, each substrate was taken out from the sealed bag and an epitaxial film was formed on the substrate by MOCVD as in Example 1. After the epitaxial film was formed, the sheet resistance of the substrate was measured. As a result, the sheet resistance was a high value of $9.9 \times 10^4 \Omega/\square$.

The Si peak concentration at the interface between the epitaxial film and the substrate was measured with SIMS and the Si peak concentration at the interface was found to be $1.1 \times 10^{17}$ atoms/cm$^3$.

EXAMPLE 4

GaAs substrates were prepared. Each GaAs substrate was produced by the VB method (vertical boat method); the substrate was doped with carbon as in Example 2; the oxygen content of the crystal was $1 \times 10^{16}$ to $1 \times 10^{17}$/cm$^3$; the crystal defect EPD (etch pit density) was 1000/cm$^2$ or less; the substrate was a semi-insulating substrate having a resistivity of $0.5 \times 10^8$ to $2.0 \times 10^8$ $\Omega$cm; and the diameter was 6 inches. As for the plane orientation of the substrate, a (100) 2°-off substrate (plane-orientation tolerance: ±0.5°) was used.

The GaAs substrate was sliced from an ingot. The outer circumference of the substrate was chamfered. The substrate was then subjected to double-side polishing with a hard polishing cloth such that both of front and back surfaces of the substrate became mirror surfaces. The surface on which a device was to be formed was further subjected to mirror-finish polishing with a hard polishing cloth such that the surface had a surface roughness RMS of 0.10 nm and a flatness total thickness variation (TTV) of 1.5 µm. The substrates were then subjected to batch cleaning using a standard-cleaning solution as in Example 1 and temporarily dried.

Within 48 hours after the standard cleaning, a 0.087 wt % aqueous solution of the surfactant C was applied to the surface of each GaAs substrate by spin-coating at a rotation rate of 1000 rpm for 15 seconds, and then dried at a high rotation rate of 2000 rpm for 35 seconds. The thickness of the surfactant layer was measured with an ellipsometer as in Example 1. At this time, the undiluted solution of the surfactant used was a solution purified and controlled such that the amount of impurities other than C, H, and O was 50 ng/mm$^3$ or less.

The treatment with the surfactant was performed with a single-wafer spin-treatment equipment that horizontally holds a wafer (substrate); and the Si concentration of the atmosphere in which the treatment was performed was controlled to be less than 0.5 µg/m$^3$. Specifically, an activated carbon filter for removing silicon-containing organic substances (siloxane) in the atmosphere was attached to the air-conditioning system; an ultra low penetration air (ULPA) filter that was not contaminated with Si and was formed from a fluorocarbon resin was attached to the treatment room in which the application was performed; thus, the dust concentration was less than 1 particle/ft$^3$. The wafer (substrate) was supported with polyimide resin pins disposed at three points in the circumference so that contamination from the circumferential portion was minimized.

While the surfactant treatment was performed, ultrapure water was supplied to the back surface to prevent the surfactant from reaching the back surface. During the drying, nitrogen gas was sprayed from back-surface nozzles to accelerate drying of the back surface. As a result, substrates having a film were obtained in which the film had a film thickness in Table V; the film-thickness variation in the surface was less than ±0.3 nm; the number of foreign particles having a size of 0.3 µm or more on the surface was 50 or less (wafer entire surface except for a region within 3 mm from the circumference, the region serving as an edge portion for a measurement device); and the amount of heavy metal on the surface analyzed with a total X-Ray reflection fluorescence (TXRF) apparatus was less than $10 \times 10^{10}$ atoms·cm$^2$. When the surface is treated by the standard cleaning and then left for a long period of time, oxidation of the surface proceeds and, as a result, a surface-state shift occurs from the hydrophilic surface immediately after the cleaning to the hydrophobic surface. Thus, the surfactant becomes less likely to adhere to the surface and the film becomes less likely to be formed on the surface. In addition, adhesion of Si in the atmosphere to the surface proceeds. Thus, the Si content of the surface is not sufficiently decreased. Accordingly, the treatment is desirably performed within 48 hours, if possible, within 24 hours after the standard cleaning is performed. The number of foreign particles on the surface was measured with a Surfscan 6220 manufactured by Tencor Corporation. Since foreign particles on the surface become defects after the formation of the epitaxial film, the number thereof is desirably minimized. Since heavy metal on the surface is less likely to evaporate at the time of heating prior to the formation of the epitaxial film, a large amount of heavy metal causes leakage at the interface. Accordingly, the amount of heavy metal is desirably at least $50 \times 10^{10}$ atoms/cm$^2$ or less, if possible, $10 \times 10^{10}$ atoms/cm$^2$ or less.

The substrates were placed in clean PP (polypropylene) wafer trays, subjected to nitrogen purging, and then sealed and stored in clean bags impermeable to oxygen and moisture. As for the storage containers, trays satisfying the siloxane outgassing amount of less than 0.01 µg/g as in Example 1 and the total outgassing amount of less than 0.5 µg/g were used. When the outgassing amount is large, surface contamination is caused, which may cause variations in the film thickness.

Epitaxial films were formed by MOCVD as in Example 1 on substrates in which the storage period after the surfactant treatment was varied. For each substrate, the Si content at the interface between the epitaxial film and the substrate and the sheet resistance were measured. The results are described in Table V. The existing cases where the standard cleaning only is performed have tendencies that, the longer the storage period, the higher the interface Si content and the lower the sheet resistance. In contrast, in the cases where the surfactant treatment is further performed, even when the storage period becomes a long period of 90 days, the interface Si content is suppressed to a low value and the sheet resistance is maintained at a high resistance that is beyond the measurement limit of the measurement device.

TABLE V

| Treatment | Film thickness immediately after substrate treatment (nm) | Epi/substrate interface impurities ($\times 10^{10}$ atoms/cm$^2$) | | | Epi/substrate interface impurities ($\times 10^{17}$ atoms/cm$^3$) | | | Storage period from treatment to epi-growth (days) | Post-epi sheet resistance ($\times 10^3$ Ω/□) |
|---|---|---|---|---|---|---|---|---|---|
| | | O | Si | C | O | Si | C | | |
| Surfactant C | 1.98 | ND | 4.2 | ND | 1.4 | 0.16 | ND | 2 | 98 |
| Surfactant C | 2.15 | ND | 2.1 | ND | ND | 0.084 | ND | 2 | 98 |
| Surfactant C | 2.03 | ND | 2.0 | ND | ND | 0.076 | ND | 2 | 98 |
| Surfactant C | 1.89 | 61 | 4.8 | 1.7 | 2.1 | 0.18 | 0.1 | 40 | 98 |
| Surfactant C | 1.68 | 37 | 6.1 | 0.9 | 1.1 | 0.19 | 0.1 | 40 | 98 |
| Surfactant C | 1.64 | 30 | 6.5 | ND | 1.0 | 0.26 | ND | 40 | 98 |
| Surfactant C | 1.72 | 28 | 7.4 | ND | 1.0 | 0.34 | ND | 40 | 98 |
| Surfactant C | 1.80 | 36 | 7.6 | ND | 1.3 | 0.34 | ND | 40 | 98 |
| Surfactant C | 1.62 | 45 | 10.0 | ND | 1.4 | 0.48 | ND | 40 | 98 |
| Surfactant C | 1.75 | 73 | 13.0 | 2.9 | 2.3 | 0.43 | 0.2 | 90 | 98 |
| Surfactant C | 1.85 | 47 | 14.0 | 2.0 | 1.7 | 0.43 | 0.2 | 90 | 98 |
| Surfactant C | 2.44 | 5.1 | 2.2 | ND | 0.2 | 0.074 | 0.09 | 27 | 98 |
| Surfactant C | 2.16 | 8.8 | 2.2 | ND | 0.4 | 0.055 | 0.07 | 8 | 98 |
| Surfactant C | 2.04 | 7.8 | 1.7 | ND | 0.3 | 0.047 | 0.08 | 8 | 98 |
| Surfactant C | 1.79 | 6.5 | 2.7 | ND | 0.2 | 0.065 | 0.1 | 8 | 98 |
| Surfactant C | 1.80 | 30 | 3.3 | ND | 0.8 | 0.10 | 0.1 | 7 | 98 |
| Surfactant C | 2.13 | 15 | 2.6 | ND | 0.4 | 0.062 | 0.08 | 8 | 98 |
| Surfactant C | 2.10 | 14 | 1.9 | ND | 0.3 | 0.038 | 0.07 | 8 | 98 |
| Surfactant C | 1.86 | 12 | 3.7 | ND | 0.3 | 0.11 | 0.1 | 8 | 98 |
| Surfactant C | 1.88 | 39 | 4.7 | ND | 1.1 | 0.14 | 0.1 | 7 | 98 |
| Surfactant C | 2.04 | 23 | 2.6 | ND | 0.08 | 0.063 | 0.08 | 3 | 98 |
| Surfactant C | 2.03 | 25 | 2.0 | ND | 0.1 | 0.040 | 0.1 | 3 | 98 |
| Surfactant C | 2.15 | 20 | 2.3 | ND | 0.7 | 0.063 | 0.07 | 90 | 98 |
| Standard cleaning only | 0.61 | 2.6 | 43.0 | ND | 0.2 | 1.5 | ND | 2 | 52.9 |
| Standard cleaning only | 0.73 | 5.6 | 81.0 | ND | 0.4 | 3.5 | ND | 27 | 7.7 |
| Standard cleaning only | 0.66 | 39 | 99.0 | ND | 1.7 | 4.0 | ND | 27 | 8.7 |
| Standard cleaning only | 0.75 | 33 | 140.0 | ND | 1.3 | 5.6 | ND | 40 | 5.0 |
| Standard cleaning only | 0.68 | 25 | 120.0 | ND | 1.0 | 3.5 | ND | 90 | 7.5 |
| Standard cleaning only | 0.63 | 9.2 | 96.0 | ND | 0.4 | 3.1 | 0.1 | 13 | 4.8 |
| Standard cleaning only | 0.71 | 8.6 | 69.0 | ND | 0.4 | 2.5 | ND | 27 | 13.2 |
| Standard cleaning only | 0.76 | 25 | 120.0 | ND | 1.0 | 9.0 | ND | 90 | 7.5 |

According to the present invention, the adhesion amount of impurities including Si to the substrate surface is small, surface roughening caused upon evaporation of the impurities is suppressed and degradation of crystallinity of the interface and flatness is suppressed, which probably leads to enhancement of device characteristics. Accordingly, according to the present invention, even when low-temperature cleaning is performed and an epitaxial film is formed, leakage current can be reduced. Thus, great advantages of cost reduction are provided by a decrease in production time and a decrease in the consumption amount of arsine serving as a source gas consumed during the cleaning. Table V indicates that the amounts of O and C at the epi/substrate interface are also small in the present invention. When a device is produced from an n-type substrate such that current flows from the epi surface to the back surface of the substrate, reduction of carriers at the interface can be suppressed and an increase in the operation voltage can be suppressed. In addition, when an electron device is produced from a semi-insulating substrate, the backgating effect and the sidegating effect can be suppressed and the high-frequency characteristics can be improved. Therefore, in addition to the effect of reducing the interface Si content, the effect provided by reduction of other impurities is also expected.

INDUSTRIAL APPLICABILITY

According to the present invention, a semi-insulating compound semiconductor substrate can be provided in which, even after long-term storage, electrical-characteristic defects are less likely to occur and epitaxial growth for a HEMT can be achieved at low cost.

REFERENCE SIGNS LIST

1: semi-insulating GaAs substrate
2: i-GaAs layer (high-purity epitaxial layer)
3: n-AlGaAs layer (electron supply layer)
4: source electrode
5: gate electrode
6: drain electrode
11: normal current flow
12: defective current flow
20: surfactant
21: organic contamination

What is claimed is:

1. A compound semiconductor substrate at least one major surface of which is mirror-polished, the mirror-polished surface being covered with an organic substance containing hydrogen (H), carbon (C), and oxygen (O),
wherein a covering film formed of the organic substance has a film thickness of 1.5 nm or more and 3.0 nm or less, the film thickness being measured with an ellipsometer.

2. The compound semiconductor substrate according to claim 1, wherein the organic substance has a molecular weight of 700 or more and 2000 or less.

3. The compound semiconductor substrate according to claim 1, wherein the organic substance is a nonionic surfactant.

4. The compound semiconductor substrate according to claim 1, wherein a relative signal intensity of a cation ($CH_3O^+$) having a mass number of 31 in TOF-SIMS analysis employing $69Ga^+$ as a primary ion is $2.4 \times 10^{-3}$ or more.

5. The compound semiconductor substrate according to claim 1, wherein a relative signal intensity of a cation ($C_3H_5O_2^+$) having a mass number of 73 in TOF-SIMS analysis employing $69Ga^+$ as a primary ion is $3.2 \times 10^{-4}$ or more.

6. The compound semiconductor substrate according to claim 1, wherein a relative intensity of a cation ($CH_3O^+$) having a mass number of 31 in TOF-SIMS analysis employing $69Ga^+$ as a primary ion is 2.0 times or more that of a standard-cleaning compound semiconductor substrate.

7. The compound semiconductor substrate according to claim 1, wherein a relative intensity of a cation ($C_3H_5O_2^+$) having a mass number of 73 in TOF-SIMS analysis employing $69Ga^+$ as a primary ion is 4.1 times or more that of a standard-cleaning compound semiconductor substrate.

8. The compound semiconductor substrate according to claim 1, wherein a higher-energy peak is detected at an energy $1.5 \pm 0.5$ eV higher than 285 eV of a $C_{1s}$ peak by synchrotron radiation XPS analysis in which an incident X-ray energy is 365 eV and a take-off angle is 90°.

9. The compound semiconductor substrate according to claim 8, wherein an integrated intensity of the higher-energy peak is 0.25 times or more an integrated intensity of the peak at about 285 eV.

10. A compound semiconductor substrate at least one major surface of which is mirror-finished, wherein a silicon (Si) peak concentration at an interface between an epitaxial film grown at a growth temperature of 550° C. and the compound semiconductor substrate is $2 \times 10^{17}$ cm$^{-3}$ or less.

* * * * *